United States Patent [19]

Lecomte

[11] Patent Number: 4,739,447

[45] Date of Patent: Apr. 19, 1988

[54] MOUNTING AND CONNECTION DEVICE FOR POWER SEMI-CONDUCTORS

[75] Inventor: René Lecomte, Mery sur Oise, France

[73] Assignee: La Telemecanique Electrique, France

[21] Appl. No.: 783,380

[22] PCT Filed: Jan. 15, 1985

[86] PCT No.: PCT/FR85/00007

§ 371 Date: Sep. 23, 1985

§ 102(e) Date: Sep. 23, 1985

[87] PCT Pub. No.: WO85/03385

PCT Pub. Date: Aug. 1, 1985

[30] Foreign Application Priority Data

Jan. 23, 1984 [FR] France ............................ 84 00983
Jan. 23, 1984 [FR] France ............................ 84 00984

[51] Int. Cl.<sup>4</sup> .............................................. H05K 7/20
[52] U.S. Cl. ...................................... 361/386; 357/79; 357/81; 363/144
[58] Field of Search ............... 361/380, 386, 387, 388; 357/81, 79; 174/16 HS; 363/141, 144

[56] References Cited

U.S. PATENT DOCUMENTS

| 4,169,975 | 10/1971 | Block ..................................... 219/492 |
| 4,218,695 | 8/1980 | Egerbacher et al. ................. 357/79 |
| 4,224,663 | 9/1980 | Maise et al. .......................... 363/144 |
| 4,288,837 | 9/1981 | Prager et al. ...................... 357/81 X |
| 4,518,982 | 5/1985 | DuBois et al. ..................... 357/81 X |

FOREIGN PATENT DOCUMENTS

| 2446235 | 2/1976 | Fed. Rep. of Germany ... 174/16 HS |
| 2711711 | 9/1978 | Fed. Rep. of Germany . |
| 2804348 | 9/1979 | Fed. Rep. of Germany . |

Primary Examiner—Gerald P. Tolin
Assistant Examiner—Jeffrey A. Gaffin
Attorney, Agent, or Firm—William A. Drucker

[57] ABSTRACT

The device comprises a sink (12) and a clamping devicew (17, 18) associated to each semiconductor component (15, 16) for applying the latter to the sink (12). The clamping device bears on one hand on the sink (12) and on the other hand on the semi-conductor (15, 16) through a laminated connection bar (20) to present, length-wise and from a clamping range (23) on a fixed support (10), a flexibility enabling the bar (20) to be applied to bearing ranges of semi-conductor components having different heights. The device may be used for variable height power semi-conductors.

8 Claims, 2 Drawing Sheets

MOUNTING AND CONNECTION DEVICE FOR POWER SEMI-CONDUCTORS

BACKGROUND OF THE INVENTION

1. Field of the Invention

The present invention relates to a device for mounting and connecting at least one power semi-conductor component to a unilateral heat sink. Such a device comprises the heat sink and a clamping device associated with each semi-conductor component for applying it against the heat sink and bearing, on the heat sink and on the semi-conductor component through a connecting bar.

Known mounting devices for power semi-conductors with unilateral cooling. that is to say provided on a single face of the semi-conductor, sometimes use an insulating case of a height sized as a function of that of the semi-conductor; in the case there is provided a spring calibrated so as to produce the prescribed clamping force. The electric power connection is provided either by means of a threaded rod extending from the case at the upper part thereof, or by a rigid connection strip extending from the case on one of the sides thereof.

Such a device has the disadvantage of requiring a restrictive association of the semi-conductor component, its case and the clamping spring, in particular as a function of the height and diameter of the component; in addition, the connecting mode used involves a cascade of electric contacts causing successive overheatings harmful for the semi-conductor and/or mechanical stresses due to rigid connections and adversely effecting the reliability of the semi-conductor;

In another known mounting device, of the bilateral cooling type, that is to say through both faces of the semi-conductor component, clamping clips are used for clamping together two heat sinks enclosing the semi-conductor. The clip comprises a calibrated spring for obtaining the prescribed clamping force. In this case, the electric connections are formed on the heat sinks which also provide the function of electric conductors.

Such a device, transposed to unilateral cooling mounts comprising one or more semi-conductor components, has the disadvantage of having to be adapted when it is desired to use semi-conductors of different heights or with wide height tolerances, either during the original mounting, or during replacement of a semi-conductor in the place of use. The desired adaptation is obtained by means of a braided connection or by means of a rigid connection with insertion of shims or other systems for bringing to the desired dimensions. These solutions as a whole have the disadvantage of being relatively expensive.

The purpose of the present invention is more especially to overcome the above mentioned defects and to create a simple device adapted to semi-conductor power components of varying heights and facilitating the mounting and connection of said components.

Its aim is to avoid the transmission to such semi-conductor components of the forces likely to be exerted on the connection elements of the device.

SUMMARY OF THE INVENTION

The invention provides then a mounting and connection device of the above mentioned type in which the connection bar inserted between the semi conductor component and the clamping device thereof is laminated so as to have in the direction of its length a great flexibility from a fixing zone on a fixed support.

The result is that the connection device adapts itself, without any adjustment or addition of shims, to semi-conductors of heights varying depending on their origin or on their manufacturing tolerances.

The laminated bar may advantageously be secured by fixing means to the fixing zone of the support formed by an insulating frame, itself fixed to the heat sink, so as to be able to bend from this fixing zone as far as its clamping zone to said semi-conductor (s). The result is the possibility of easily removing the bar and a great ease in replacing the semi-conductors.

When the device comprises several semi-conductor components, the insulating frame may have, between two adjacent semi-conductors, a bearing point for the laminated bar, the height of this bearing point with respect to the surface of the heat sink on which the semi-conductors rest being less than the minimum admissible height of the semi-conductors.

Furthermore, the device may advantageously comprise, for the laminated connecting bar, retaining means such as studs, recesses or ribs avoiding the transmission to the semi-conductors of the forces exerted as required on the connection elements associated with the laminated bar.

A first rigid connection element may be advantageously disposed in direct electric contact with the laminated bar, while being housed and clamped in the insulating frame and fixed thereto so as to relieve the laminated bar of the forces imposed on the connecting element.

A second rigid connecting element formed by a blade may be held in position and clamped in the insulating frame by means of a retaining structure provided for example in the frame, while being inserted between the heat sink and the insulating frame, the end of the second connecting element being in direct electric contact with the heat sink.

BRIEF DESCRIPTION OF THE DRAWINGS

The advantages and features of the invention will be clear from the following description and the accompanying drawings, in which.

DESCRIPTION OF THE PREFERRED EMBODIMENT

Figure 1:
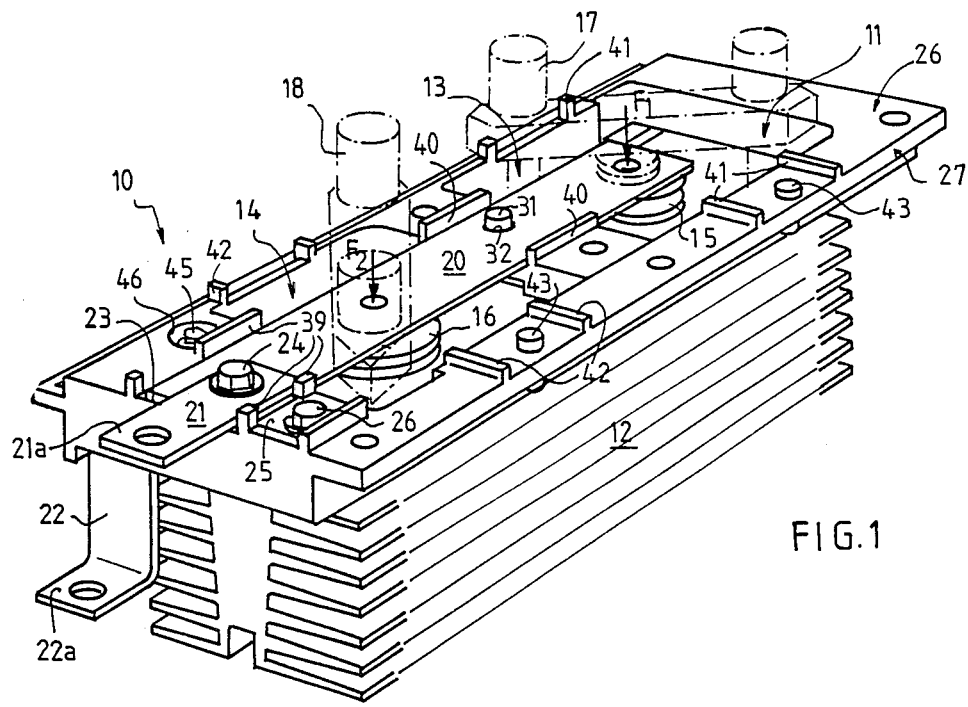
FIG. 1 shows a perspective view of a mounting and connection device according to the invention, comprising two power semi-conductors and a connection bar associated with these semi-conductors.
Figure 4:
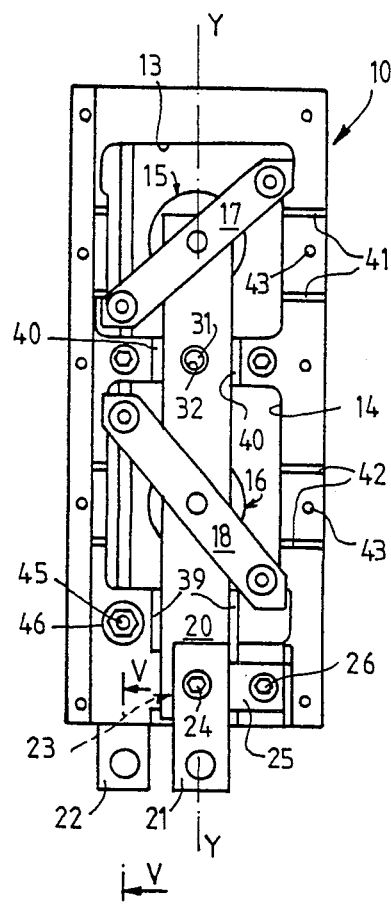
FIG. 4 shows a front elevation of the device of FIG. 1.

The mounting and connection device shown in the Figures comprises a molded frame 10 made from an insulating material having a recess 11 in which is fitted the unilateral heat sink 12 made for example from aluminium; frame 10 is fixed to the heat sink by means of screws and comprises two windows 13, 14 provided for housing, in each one, a power semi-conductor component 15, 16 of varying height and diameter, for example a diode or a thyristor. The frame may of course have a larger number of windows for housing semi-conductors. Several such frames may be associated for example by mutual fitting together and fixing:

With each semi-conductor 15, 16 there is associated a clamping device 17, 18 shown in FIG. 4 and bearing, on the heat sink and on the semi-conductor through a common connecting bar 20 made from copper. Each clamping device 17, 18 exerts a respective force $F_1$, $F_2$ on its semi-conductor 15, 16 and comprises a flange disposed at 45° with respect to the longitudinal axis Y—Y of the laminated bar, the ends of the flange being shaped with a bevel, a chamfer or a rounded portion for respecting a predetermined isolating distance from an adjacent metal wall of a chassis or an adjacent flange.

Figure 2:
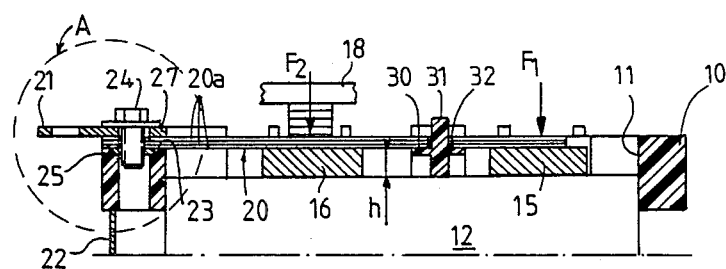
FIG. 2 shows in side elevation a section of the device of FIG. 1 through a plane of symmetry of the bar.

According to the invention, bar 20 is laminated and is formed of several superimposed blades 20a (FIG. 2) whose flexural capability is predetermined in correlation with the forces $F_1$, $F_2$; in the present example three blades are used. Bar 20 is in electrical contact with a first connection element 21 such as a blade, whereas a second connection element 22 is housed in the frame and fixed directly to the heat sink 12 in direct electric contact therewith so as to provide a current path 21, 20, 15, 16, 12, 22; the connection elements, through their free ends 21a, 22a, provide connection for conductors external to the mounting device.

Figure 5:
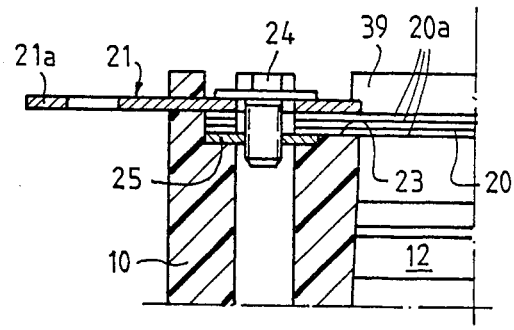
FIG. 5 shows on a larger scale the detail A of FIG. 2.

The laminated bar 20 rests at one end on a bearing zone 23 of frame 10 (FIG. 5) and it is fixed to this zone by fixing means comprising a screw 24; screw 24 also serves for holding the connection element 21 in position and for this purpose cooperates with a tapping in a fixed transverse steel bar 25 engaged in a housing provided in the frame and itself fixed by a screw 26 to the frame; screw 24 passes freely through an opening 27 formed in the laminated bar, for relieving bar 20 of the pivoting or wrenching forces exerted on blade 21. Bar 20 and blade 21 are fixed to the front face 28 of the frame, whereas blade 22 is fixed under a rear face 29 of a frame.

Between the two windows 13, 14, frame 10 comprises a bearing zone 30 having a stud 31 penetrating into an orifice 32 in the laminated bar 20. The height h of zone 30 with respect to the upper surface of the heat sink 12 is preferably less than the minimum admissible height of the semi-conductors 15, 16. Bar 20 is further immobilized by retaining means such as lateral stops 39, 40 integrally molded with frame 10; these stops prevent the bar from moving transversely to its axis Y—Y.

Figure 3:
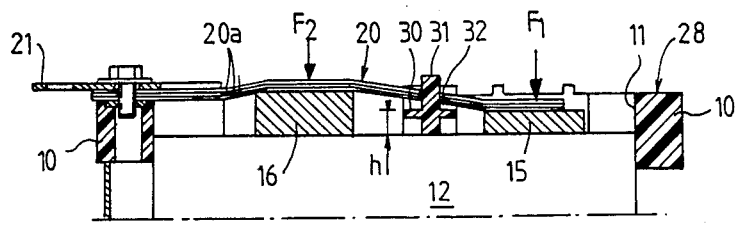
FIG. 3 is a similar view showing the profile assumed by the bar with two semi-conductors of different heights.

In the FIG. 3 has been shown, in a highly exaggerated way, the flexural capability of the laminated bar 20 in the case where this bar is applied on two semiconductors 15, 16 of different heights. The difference in height that bar 20 is capable of accomodating may for example be of the order of 2.5 mm.

The laminated bar 20 may advantageously be positioned and fixed on frame 10 perpendicularly to the position illustrated in FIG. 1, by means of recesses or ribs 41, 42 and pins 43 integrally molded with the frame; the orifice 32 provided in the laminated bar then lets pass therethrough the positioning and bearing stud 31.

Figure 6:
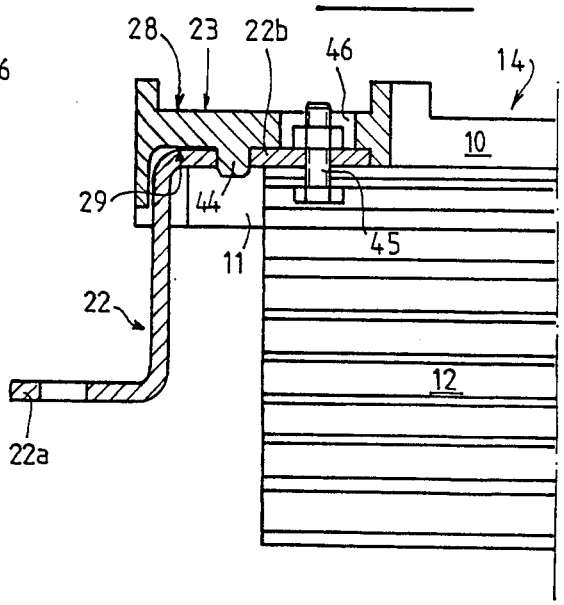
FIG. 6 shows, in a sectional view through the plane V—V of FIG. 4, the insertion of a connection element between the heat sink and the frame.

In the sectional view shown in FIG. 6, it can be seen that the second connecting element 22 is formed by a blade bent so as to have a first end 22a for connection with an external conductor and a second end 22b is inserted between the heat sink 12 and frame 10. End 22a is thus separated by a sufficient distance from the connecting end 21a of blade 21. End 22b is positioned with respect to the frame by means of a stud 44 provided thereon and projecting into the recess 11 of the heat sink. Blade 22 is fixed to the heat sink 12 by means of a screw-nut system 45 whose nut is accessible through orifice 46 in the frame.

It goes without saying that different modifications may be made to the embodiment described and shown without for all that departing from the scope and spirit of the invention.

What is claimed is:

1. A mounting assembly for single-side cooling semi-conductor components comprising:
   i. an insulating frame defining at least one window and having first and second faces;
   ii. a thermally and electrically conductive formed air cooled heat sink secured to the frame, said heat sink being shaped as a block having a substantially flat surface portion facing said window and extending from said surface portion away from the second face of the frame;
   iii. at least one power semi-conductor element having first and second power terminals, the second power terminal engaging and being in direct electric contact with said surface portion of the heat sink;
   iv. first and second power supply terminals respectively secured to the first and second faces of the frame, the second power supply terminal being connected to the heat sink;
   v. an electrically conductive bar secured to the frame at first and second anchoring points which are substantially level with said first face, said bar having a portion facing said window, said bar portion having first and second opposite bearing surface portions, the second bearing surface portion engaging the first power terminal of said semi-conductor element, said bar being electrically connected to the first power supply terminal and
   vi. clamping means bearing on the bar for exerting a pressure on the first bearing surface portion thereof.

2. A semi-conductor component as claimed in claim 1, wherein said frame has a further window and, located between said window and said further window an insulating anchoring member facing said surface portion of the heat sink and defining a further anchoring point for the bar at a predetermined distance from the heat sink, said component comprising a further semi-conductor element having first and second power terminals separated by a distance smaller than that which separates the first and second power terminals of said semi-conductor element, the second power terminal of said further semi-conductor element engaging said surface portion of the heat sink, the bar having first and second substantially parallel further bearing surface portions, the further second bearing surface portion engaging the first power terminal of the further semi-conductor element and further clamping means for exerting a pressure on the further first bearing surface portion, the predetermined distance being equal or less than the distance between the first and second terminals of the further semi-conductor element.

3. A semi-conductor component as claimed in claim 1, wherein anchoring means are provided at said anchoring points, said anchoring means being adapted to avoid transmission to the bar of any force exerted on the power supply terminals.

4. A semi-conductor component as claimed in claim 3, wherein said anchoring means are adapted for allowing the bar to be fitted in any one of two directions perpendicular with respect to each other.

5. A semi-conductor component as claimed in claim 1, wherein said second power supply terminal has one end clamped between the frame and the heat sink.

6. A semi-conductor component as claimed in claim 1, wherein retaining means are provided to secure the first power supply terminals to the frame while avoiding transmission to the semi-conductor element of any force exerted on the first power supply terminal.

7. A semi-conductor component as claimed in claim 1, wherein said clamping means has a flange disposed at 45° with respect to the longitudinal axis of the laminated bar.

8. A mounting assembly for single-side cooling semi-conductor components comprising:
   i. an insulating frame defining at least one window and having first and second faces;
   ii. a thermally and electrically conductive formed air cooled heat sink secured to the frame, said heat sink being shaped as a block having a substantially flat surface portion facing said window and extending from said surface portion away from the second face of the frame ;
   iii. at least one power semi-conductor element having first and second power terminals, the second power terminal engaging and being in direct electric contact with said surface portion of the heat sink;
   iv. first and second power supply terminals respectively secured to the first and second faces of the frame, the second power supply terminal being connected to the heat sink;
   v. an electrically conductive bar comprising at least two superimposed blades, said bar being secured to the frame at first and second anchoring points which are substantially level with said first face, said bar having a portion facing said window, said bar portion having first and second opposite bearing surface portions, the second bearing surface portion engaging the first power terminal of said semi-conductor element, said bar being electrically connected to the first power supply terminal and
   vi. clamping means bearing on the bar for exerting a pressure on the first bearing surface portion thereof.

* * * * *